United States Patent
Chu et al.

(10) Patent No.: US 6,239,080 B1
(45) Date of Patent: May 29, 2001

(54) BA-CA-CU-O COMPOSITIONS SUPERCONDUCTING AT UP TO 126K AND METHODS FOR MAKING SAME

(75) Inventors: Ching-Wu Chu; Yu-Yi Xue; Zhong L. Du, all of Houston, TX (US)

(73) Assignee: Thr University of Houston - University Park, Houston, TX (US)

(*) Notice: Subject to any disclaimer, the term of this patent is extended or adjusted under 35 U.S.C. 154(b) by 0 days.

(21) Appl. No.: 09/341,313

(22) PCT Filed: Nov. 17, 1997

(86) PCT No.: PCT/US97/22072

§ 371 Date: Jul. 6, 1999

§ 102(e) Date: Jul. 6, 1999

(87) PCT Pub. No.: WO98/22409

PCT Pub. Date: May 28, 1998

Related U.S. Application Data

(60) Provisional application No. 60/031,188, filed on Nov. 18, 1996.

(51) Int. Cl.[7] .............................. C04B 35/01; A01B 12/00
(52) U.S. Cl. ............................................. 505/125; 505/126
(58) Field of Search .................................. 505/125, 776, 505/779, 126; 252/519.1

(56) References Cited

U.S. PATENT DOCUMENTS 5,578,551 * 11/1996 Chu et al. ............................. 505/125

FOREIGN PATENT DOCUMENTS

447260 * 9/1991 (EP).

OTHER PUBLICATIONS

Xue et al "Phase Identification of the New 126 K BaCaCuO..." *Physica C*, 294(3&4) pp 316–326 (Abstract only), 1998.*

Hosomi et al "Identification of Superconducting phases..." *J. Mater Chem* (1999) 9(5), p 1141–1148 (Abstract only).*

Hosomi et al "Investigation of an Unstable Tc–126K phase..." Adv. Supercon. XI Proc. Int. Symp. Supercond. 1998, vol. 1, 567–370 (Abstract).*

Duan et al "Superconducting Thallium barium calcium copper oxide..." AIP Conf. Proc. (1992) 251, pp 153–61 (Abstract only).*

* cited by examiner

*Primary Examiner*—Mark Kopec
(74) *Attorney, Agent, or Firm*—Akin, Gump, Strauss, Hauer & Feld, L.L.P.

(57) ABSTRACT

A material having a superconducting transition temperature ($T_c$) of 126 K under ambient pressure has been identified. The superconducting material belongs to a Ba—Ca—Cu—O compound family where the cation ratio of Ba:Ca:Cu is 2:2.5+0.5:3.5±0.5. The superconducting material is produced from precursor oxides having nominal formula $Ba_2Ca_{n-1+x}Cu_{u/y}O_x$ wherein n=3 or 4 and x is 0.4 to 1.0 and y is 0 to 0.8 using high-pressure synthesis. Final synthesis temperature was maintained at less than 950° C. Formation of the superconducting material is sensitive to the state of the precursor oxides, the carbon content of the precursor, and the synthesis temperature, pressure and time.

14 Claims, 7 Drawing Sheets

US 6,239,080 B1

BA-CA-CU-O COMPOSITIONS SUPERCONDUCTING AT UP TO 126K AND METHODS FOR MAKING SAME

CROSS-REFERENCE TO RELATED APPLICATIONS

This application claims the benefit of and priority to U.S. Provisional Application No. 60/031,188, filed Nov. 18, 1996, and entitled "126K Superconducting Phase in the Ba—Ca—Cu—O System."

STATEMENT REGARDING FEDERALLY SPONSORED RESEARCH

This invention was partially supported by grants from the U.S. Government, which has certain rights in this invention.

BACKGROUND OF THE INVENTION

1. Field of the Intention

This invention relates to superconducting material; more particularly, to a superconducting material containing barium, calcium, copper and oxygen; and to a method for making such superconducting Ba—Ca—Cu—O materials.

2. Description of the Related Art

High temperature superconductors (i.e., those which superconduct at or greater than 77K) were first discovered in 1987. Prior to that time the highest superconducting transition temperature ($T_c$) material discovered since the beginning of research thereto in 1911 was 23K (degrees kelvin) in an intermetallic composition of NbGe which is now referred to as a conventional low temperature Superconductor (LTS). Materials having a high temperature superconducting (HTS) transition to a superconducting state at critical temperatures ($T_c$) above 77K belong to the cuprate family, and various such cuprates have now been synthesized that exhibit superconductivity. For example, in U.S. Pat. No. 5,578,551, issued to C. W. Chu et al., a method of synthesis of a Hg—Ba—Ca—Cu—O composition as a high temperature superconductor is taught, and this patent is incorporated by reference for all purposes. A critical temperature, $T_c$, for transition of this material to its superconducting state of up to 135K was disclosed for the HgBa—Ca—Cu—O composition described by the Chu '551 patent. High superconducting transition temperatures have also been disclosed for similar cuprates having thallium (Tl) instead of Hg. However, mercury (Hg) and thallium (Tl) are both toxic and volatile, and high temperature superconductors that do not require, use or involve the hazards of such volatile and toxic elements or compounds are desired.

In a paper entitled "124K Superconductivity in Cu—Ba—Ca—Cu—O" and published in *Modern Physics Letters B*, Vol. 9, No. 21 (1995) pages 1397–1406 (hereinafter the "Gao et al. paper"), it was stated that a series of materials of a nominal formula $A_1Ba_2Ca_3Cu_4O$, where $A=(Cu_{1-x}M_x)$ with M=Ag or C and x=0, 0.25 or 0.75 was synthesized at pressures of 5 to 6 Gpa and temperatures of 820 to 1200° C. from appropriate mixtures of BaO, CaO and CuO together with AgO to supply Ag or $CaCO_3$ to supply C. The highest superconducting transition temperature, $T_c$, observed for this compound type was in an A $Ba_2Ca_3Cu_4O_{10+\delta}$ system wherein $A=(CU_{0.75}Ag_{0.25})$ and was 124K.

The Gao et al. paper relates that twenty Cu—Ba—Ca oxides within the family $A_1Ba_2Ca_3Cu_4O_x$ wherein $A=(Cu_{1-x}M_x)$ with M being Ag or C and x being 0.0, 0.25 or 0.75 were synthesized under different conditions. Nearly single-phase Cu-1234 [$Cu_1Ba_2Ca_3Cu_4O_{10+\delta}$] was synthesized at about 5 GPa in those samples prepared at temperature of or above 950° C. with a $T_c$ equal to 117K. A superconducting phase with a $T_c$ up to 124K was also observed to exist in four multiphases samples of $(Cu_{0.75}Ag_{0.25})Ba_2Ca_3Cu_4O_x$ prepared in a graphite furnace at 5 to 6 GPa, but only at considerably lower temperatures of 820 and 870 ° C. In these four samples the 124K transition appeared in both field-cooled (FC) and zero field-cooled (ZFC) susceptibility (Z) and was usually accompanied by steps at about 117K and 80K, which were thought to belong to Cu-1234 and Cu-1223 phases, respectively. It was concluded by Gao et al., based on structural analysis, that slight differences in local structure (crystal-structure or cation-ordering) or stoichiometry (or doping) within the Cu-12(n–1)n family (n=4 or 3), was possibly responsible for the 124K superconductivity.

A superconducting transition with a $T_c$ up to 124K was thus observed in some multiphase samples of the Ag—Cu—Ba—Ca—Cu—O family. The Gao et al. paper also suggest that C-doping may be important to the formation of this 124K phase composition.

There remains a need, however, to identify more precisely the stoichiometric proportions of these cations, and for a method to reliably synthesize them and a need remains to find compounds having a higher transition temperature (Tc) without need for doping with a volatile and/or toxic atomic element.

SUMMARY OF THE INVENTION

Materials having a superconducting transition temperature, $T_c$, of 126K and 16K have been discovered, and the phase compositions responsible for these superconducting transitions do not contain mercury (Hg), thallium (Tl) or other volatile or toxic elements therein. The superconducting phase composition is in the Ba—Ca—Cu—O family of materials the nominal formula for which has an atomic ratio of Ba:Ca:Cu of 2:2.5±0.5:3.5±0.5. The 126K phase composition therein is believed to have as a basic idealized formula that of $Ba_2Ca_{n-1}Cu_nO_z$ wherein n is 3 whereas the superconducting phase at Tc of 116K is believed to of a formula wherein n=4. The cation ratio of Ba:Ca:Cu of the 126K superconducting materials is 2:2.5±0.5:3.5±0.5. The cation ratio for the 116K material is 2:3.5±0.5; 4.5±0.5. The material containing such phases must be made without the presence of a carbon content, otherwise the 126 K superconducting phase composition will not form or will be destroyed. The material having this composition is synthesized under high pressure at between about 5.5 and 6.0 GPa and is held at a final synthesis temperature of below 1050° C., and preferably below 950° C. Upon exposure to humid air, the superconducting composition within this material which superconducts at a $T_c$ of 126K or 116K transforms into a more stable superconducting material having a superconducting transition temperature of about 90 K to about 114K, respectively.

DETAILED DESCRIPTION OF THE PREFERRED EMBODIMENTS

Figure 1:
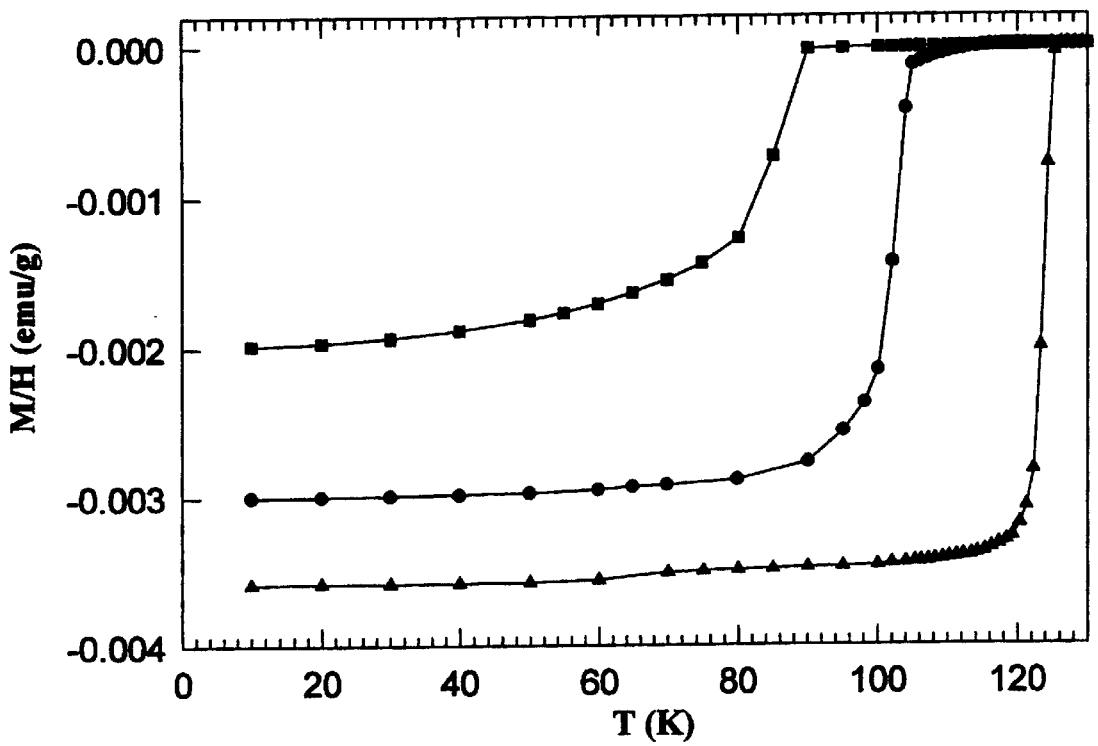
FIG. 1 shows field-cooled magnetic susceptibility, $\chi_{(emu/g)}$ versus temperature, $T_{(k)}$, for three Ba—Ca—Cu—O samples showing distinct superconducting transitions at 126, 104, and 90K.

A material has been found to have a superconducting transition temperature ($T_c$) up to 124K in multiphased samples of an Ag doped Ba—Ca—Cu—O system at ambient pressure. This superconducting phase, as first detected and reported by the Gao et al. paper, accounted for no more than 5% of the sample volume in but four of the twenty initial samples and was rather unstable. With, only four out of twenty initially produced samples having this low of a content of the 124K phase, any systematic study of this phase was extremely difficult. Consequently, it was at that time thought that the 124K superconducting transition was attributed to a phase closely related to $(Cu_{1-x}C_x)Ba_2Ca_{n-1}Cu_nO_z$ [(Cu-12(n-1)n] with a possible alteration in the local atomic arrangement or stoichiometry due to the Ag substituted doping for C.

By investigating the formation of the various phases in the Ba—Ca—Cu—O system, a 126K superconducting phase has been reproducibly synthesized, where the superconducting phase accounts for up to about 25% and even more of the sample volume without C or Ag doping. A $T_c$ of 126K is the highest transition temperature discovered thus far for material systems that do not contain volatile toxic elements such as Tl or Hg or other metallic elements. The 126K superconducting transition is associated with a material of nominal formula having a cation ration of Ba:Ca:Cu equal to 2:2.5±0.5:3.5±0.5. Also found was another superconducting phase having a $T_c$ of 116K. This cation ratio of these superconducting phases are different from any of the known cuprate high $T_c$ (HTS) superconductors. However, the 126K superconducting phase, as well as the 116K superconducting phase, was found to be unstable, transforming over time when exposed to air into compositions which themselves are still HTS compositions but which superconduct at lower Tc temperatures in the range of 90–114K.

To make samples of the superconducting material of the present invention, precursors were prepared from binary oxides such as BaO, CaO and CuO, and preferably ternary oxides such as $Ba_2Cu_3O_5$, to form nominal compositions such as $CuBa_2Ca_{n-1}Cu_nO_z$[Cu-12(n-1)n] with n equal to 3 or 4, or $Ba_2Ca_{n-1}Cu_nO_z$[2(n-1)n] with n equal to 3 or 4. The compositions were prepared by thoroughly mixing amounts of the precursors appropriate to supply the desired atomic ratios of Ba:Ca:Cu in a glove-bag filled with Ar (argon) or $N_2$ (nitrogen). The oxide mixtures were compacted into pellets and fired in air or in flowing oxygen at between 650 and 900° C. for 40 to 84 hours, with intermittent pulverization and compaction. The pellets were then subsequently powdered, mixed with various amounts of AgO (silver oxide) as an oxider, compacted into cylinders, and wrapped in gold foil for high-pressure synthesis.

High-pressure synthesis was carried out in a high pressure cell at between about 5.5 and 6.0 GPa in a multi-anvil model 1990 Walker module available from Rockland Research Corporation. A calcium-doped $La_2CrO_4$ furnace was used to prevent carbon contamination. Carbon contamination, such as from air or furnaces, must be prevented because it was found to adversely affect formation of the superconducting phase (126K and/or 116K) of interest. The pressure was determined using a calibrated load versus pressure curve provided by Rockland Research Corporation. The temperature was measured using a D-type thermocouple (W-Re 3%/W-Re 25%) located next to the sample inside the high pressure cell. For annealing, the precursor cylinders were wrapped in gold foil and were heated from room temperature to between 800 and 1200° C. at a rate of about 20° C. per minute. The precursors were maintained at their final synthesis temperature ($T_s$) for about 0.5 to 1.5 hours and then were cooled to room temperature at a rate of about 200 to 400° C. per minute.

Some samples were characterized after their synthesis, but before the annealing process, while others were characterized after the annealing process. $T_c$ was measured resistively by a standard four-probe technique and magnetically by a Quantum Design SQUID Magnetometer. (A SQUID is a superconducting quantum interference device, a sensitive device for measuring diamagnetism). Measurements for X-ray diffraction (XRD) were made using a Rigaku D-MAX/BIII powder diffractometer. The morphology or structure of the samples was determined by scanning electron microscope (SEM) and transmission electron microscope (TEM). The SEM used was a JEOL 8600, and the TEM used was a JEOL 2000 FX, which was operated at 200,000 volts. Both the SEM and TEM were equipped with an energy dispersive spectrometer for X-ray analysis. The TEM specimens were prepared by crushing the samples in a glove-bag filled with Ar to make a powder and dispersing the powder on a carbon holey film supported by a nickel grid.

Samples made using these procedures were found to have various superconducting phases. It was found that in this Ba—Ca—Cu—O system, the appearance of various superconducting phases was quite dependent on the state of the precursor oxides, the carbon content of the precursor, and the synthesis temperature and pressure. Even the synthesis time was found to exert a significant influence under some conditions. It was discovered that a phase having a superconducting transition temperature, $T_c$, of 126K can be produced and that this 126K phase is very different from a phase having the structure of a $Cu_1Ba_2Ca_{n-1}Cu_nO_{2n+2+\delta}$ type of compound [a Cu-12(n-1)n] wherein n is 3 or 4.

It was found that a Cu-12(n-1)n phase could be made if the final synthesis temperature, $T_s$, was above 900° C. and the synthesis pressure was between 5.5 and 6.0 GPa, and the Cu-12(n-1)n phase was found to be stable up to a final synthesis temperature, $T_s$, of about 1100° C. or even higher. The final synthesis temperature, $T_s$, was preferably about 1020° C. for $Cu_1Ba_2Ca_2Cu_3O_{8+\delta}$ type compound [Cu-1223] of n=3 and 1050° C. for an n=4 $Cu_1Ba_2Ca_3Cu_4O_{10+\delta}$ type compound [Cu-1234]. The formation of an Cu-12(n-1)n type compound required partial carbon (C) substitution for copper (Cu), yielding a material having the stoichiometric ratio of $(Cu_{0.5}C_{0.5})Ba_2Ca_{n-1}Cu_nO_z$. The superconducting transition temperature, $T_c$, for this phase, [Cu-12(n-1)n], was 113K in as-synthesized samples, which were not put through the annealing process.

The family Ba—Ca—Cu—O within which the 126K superconducting phase composition was determine to exist is represented by the nominal formula

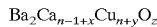

$$Ba_2Ca_{n-1+x}Cu_{n+y}O_z$$

wherein n equals 3; and x is 0.4 to 0.9; y is 0 to 0.7 and z represents the total oxygen content. Within this family line up to 25 volume % and greater of the material of the sample may comprise the 126K superconducting phase composition. Upon exposure of this material to an atmosphere containing $CO_2$ and $H_2O$ (such as atmospheric air) the 126K superconducting phase composition will, with time, undergo a transformation to a phase composition that superconducts at 90° K. and which may be represented by the formula $Ba_2Ca_2Cu_3(Ca_{x/2}Cu_{y/2}H_vC_t)_2O_{8+\delta+d}$, wherein a content of carbon (t) and/or hydrogen (v) and oxygen (d) of the $CO_2$ and $H_2O$ intercalates within the crystalline structure of the 126K phase composition. Also, within the family of the above first given nominal formula there exist a 116K superconducting phase composition wherein n=4 and x is 0.4 to 0.9 and y is 0 to 0.9. This 116K superconducting phase composition transforms, with time, upon exposure to $CO_2$ and $H_2O$ to a 114K superconducting phase which may be represented by the formula $Ba_2Cu_3Cu_4(Ca_{x/2}Cu_{y/2}H_vC_t)_2O_{10+\delta+d}$.

In comparison to other Tc>120K high temperature superconducting compositions heretofore reported which require incorporation of a volatile toxic element such as Tl or Hg as in the case of $Tl_2Ba_2Ca_2Cu_3O_{10+\delta}$(Tc≅125K), $HgBa_2CaCu_2O_{6+\delta}$(Tc 127K), or $HgBa_2Ca_2Cu_3O_{8+\delta}$(Tc 134K), the compositions of this invention are clearly different in that they are superconductive at high temperature without the requirement of a volatile toxic element in their make-up. Further, the HTS compositions of this invention are clearly different and distinct in structure and element make-up from prior Ba—Ca—Cu—O systems that have been investigated and found to form superconducting compositions only if there is a partial substitution of carbon (C) for copper (Cu). To make the 126K or 116K superconducting phase compositions of this invention, or their lower temperature $CO_2/H_2O$ transformation analogues, it was found that the final synthesis temperature, $T_s$, should preferably be below about 950° C. and the sample could not have carbon substitution for copper, contrary to formation conditions for the previous known Cu-12(n-1)n superconductive phase compositions. At least two other superconducting phases have also been noted to exist in the nominal compositions of the Ba—Ca—Cu—O materials of this invention, with $T_c$'s of 104K and 90K. These superconducting transition temperatures were determined by field-cooled magnetic susceptibility, $\chi$, as measured in electromagnetic units (emu) per gram (g).

Figure 2:
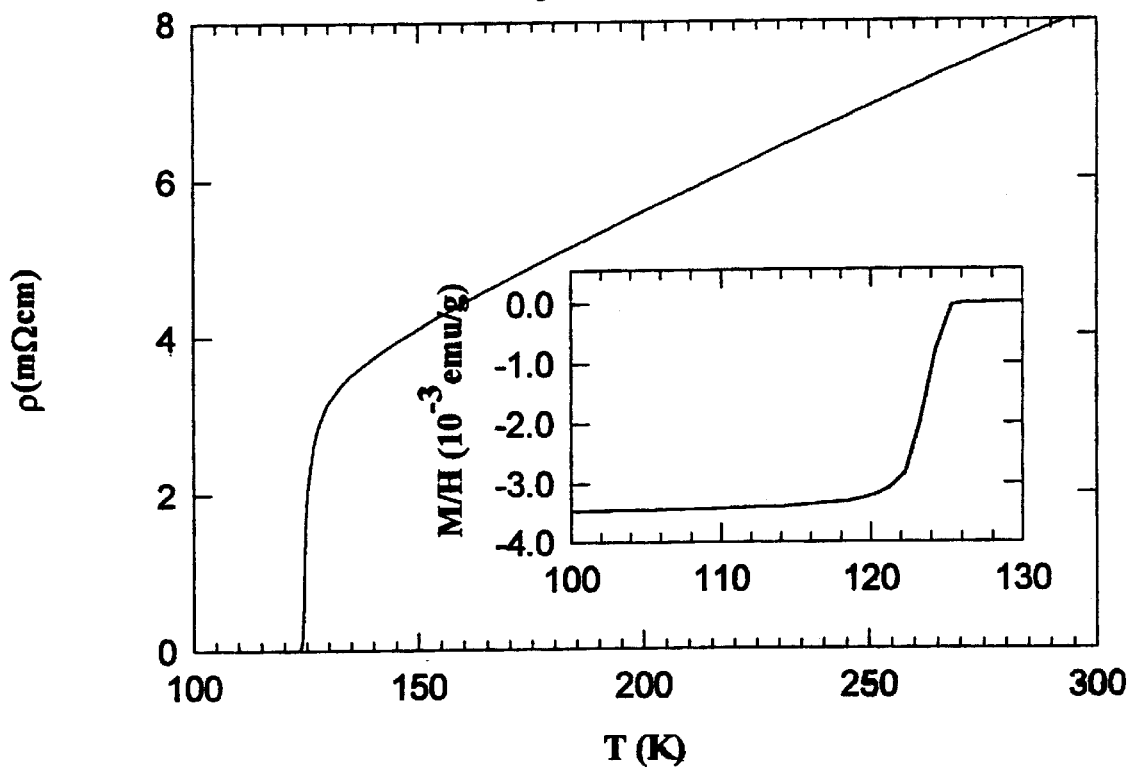
FIG. 2 shows electrical resistivity, $\rho_{(m\Omega cm)}$, versus temperature, $T_{(k)}$, for a 126K superconducting transition in a Ba—Ca—Cu—O sample, and the insert shows magnetic susceptibility. $\chi_{(10^{-3} emu/g)}$, versus temperature, T, for the same sample.

As seen in FIG. 1, magnetic susceptibility, $\chi$, becomes strongly negative in a superconducting material at its superconducting transition temperature. Magnetic susceptibility data for the phase composition having a $T_c$ of 126K is indicated by the points "▲", while the phase composition having a $T_c$ of 104K is indicated by the points "●", and the phase composition having a $T_c$ of 90K is indicated by the points "■." Resistivity, $\rho$, is another means of determining superconductivity, where electrical resistance drops to zero (or such a minute quantity of $\rho$ as to be unmeasurable) when a superconducting material is cooled to below its $T_c$. The resistivity, $\rho$, is plotted for the 126K superconducting phase in FIG. 2, and the inset in FIG. 2 illustrates the magnetic susceptibility, $\chi$, for the same material.

Figure 3:
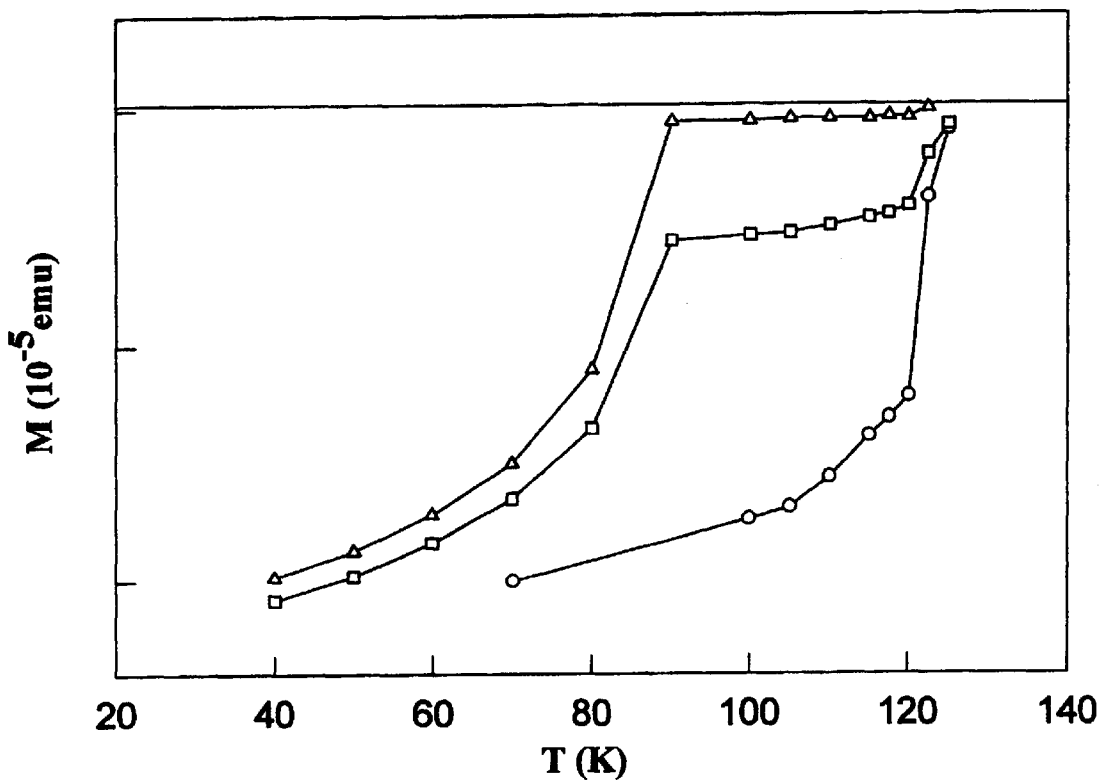
FIG. 3 shows that the phase having a 126K transition temperature transforms when exposed to air. The points indicated by "○" are for a fresh sample, while the points indicated by "□" and "Δ" are for samples exposed to air for three hours with the "Δ" sample thereafter aged in a desiccator for 100 hours, respectively.

Turning now to FIG. 3, it was found that the $T_c$ of these 126K samples transforms with time when exposed to air, particularly after being pulverized, in contrast to a Cu-1223 phase composition. The 126K transition disappears while in turn a distinct transition shows up at about 90K. The points indicated by "○" are for a fresh 126K sample, while the points indicated by "□" and "Δ" are for a 126K sample exposed to air for three hours and that sample (Δ) exposed to air for three hours then aged in a desiccator for 100 hours. The discrete degradation of $T_c$ in air suggests that there may exist at least two different phases in the Ba—Ca—Cu—O materials prepared and studied. The phase with the lower $T_c$ is more stable than the phase with the higher $T_c$.

Figure 4:
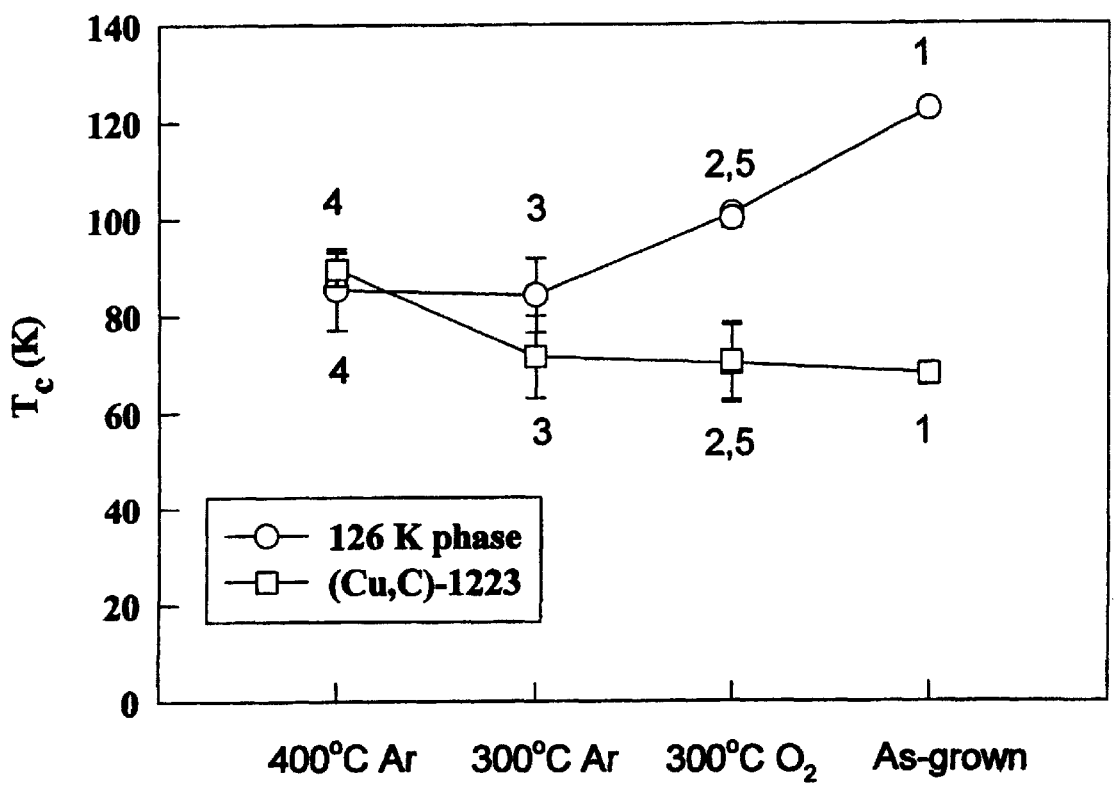
FIG. 4 shows the $T_c$'s for each of two samples, one with a 126K phase and the other with a Cu-1223 phase "□", each as made and then thereafter subjected to prolonged annealings in the indicated gas atmospheres at temperatures as indicated.

With reference to FIG. 4, the 126K transition temperature phase composition was compared to a pure Ar annealed Cu-1223 phase composition (Tc 120K) to determine whether the 126K phase composition was substantially the same as a Cu-1223 composition but annealed so as to have a different oxygen level. The two phase compositions were found to be quite different. The points labeled as "○" are for a sample having a 126K phase composition, and the points labeled as "□" are for a sample having a (Cu, C)-1223 phase composition. Several sequential annealings were carried out, and the $T_c$ was determined for each sample after prolonged annealings. Each annealing step was made at a certain temperature in a fixed Ar atmosphere, or an $O_2$ atmosphere, as indicated, for a time period long enough for thermal equilibrium to be achieved as evident by detecting no more change in the $T_c$'s of the respective samples with further annealing. The $T_c$'s of the two samples are very different under the same conditions, as shown in FIG. 4, which shows that the two phases are not the same. Thus, the 126K superconducting phase composition is not a Cu-1223 superconducting composition.

Figure 5:
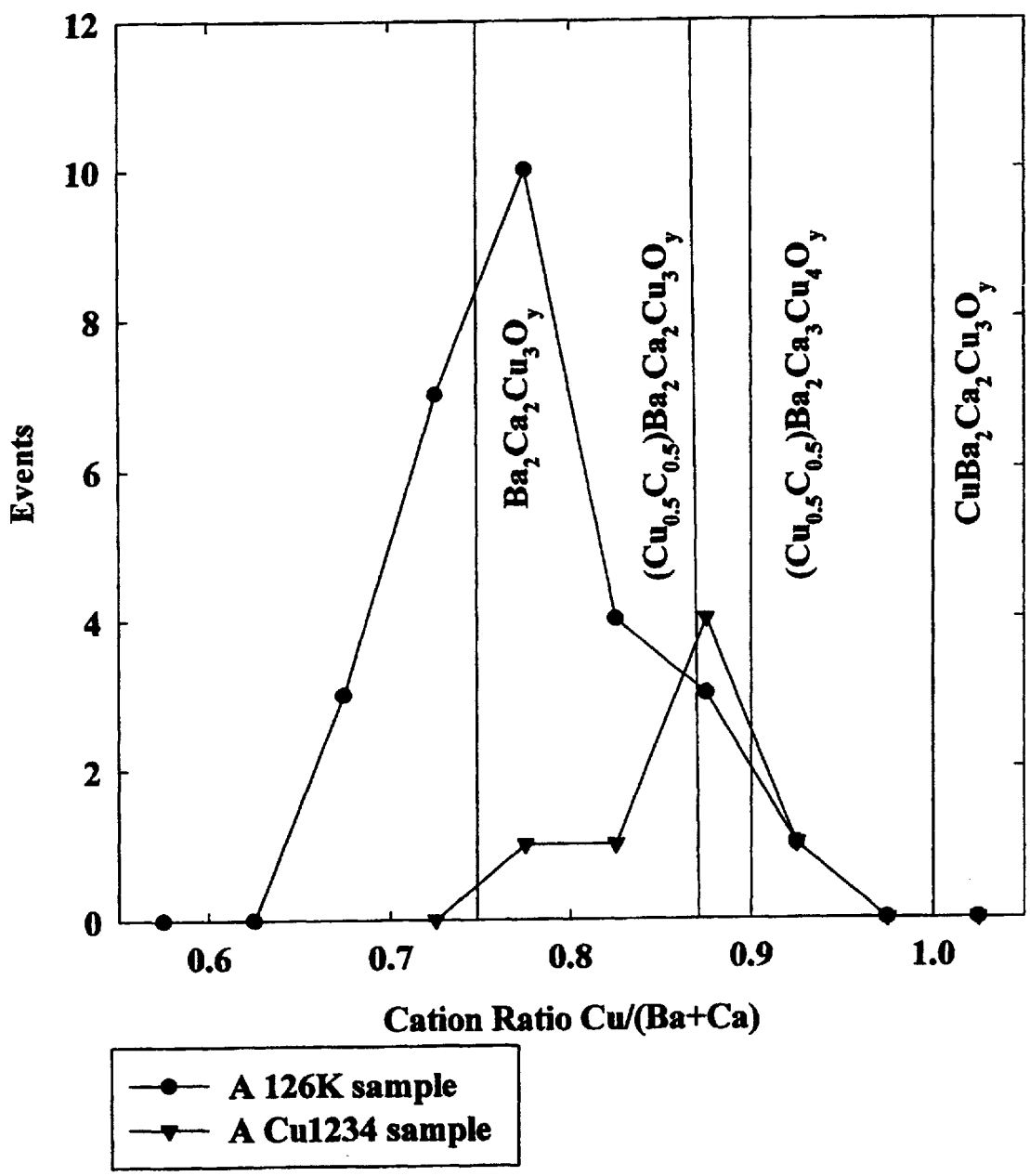
FIG. 5 shows a cation ratio distribution in a 126K-transition sample "□" and in a Cu-1234 sample "O", where the distribution was made using a statistical study of X-ray analyses.

With reference to FIG. 5, a statistical study on the cation ratios of some of the samples was made using X-ray analysis. The points labeled as "□" are for a sample having a 126K superconducting phase composition, and the points labeled as "o" are for a sample having a Cu-1234 superconducting phase composition. About 20% of the sample volume of the sample material of this invention contained the 126K phase. The cation ratio distribution was determined for grains in the sample materials that contained all three cations of Ba, Ca, and Cu. It was found that the majority of the grains of the sample material of this invention with all three elements have a cation ratio of Ba:Ca:Cu equal to 2:2.5±0.5:3.5±0.5. In sample materials of this invention which also contained a phase with the superconducting transition temperatures of about 104 and 90K, grains with all three elements were of ideal cation ratios of Ba:Ca:Cu equal to 2:3:4 and 2:1:2.

Although a Ba—Ca—Cu—O like material was studied previously, it was found then to form $(Cu_{1-y}C_y)Ba_2Ca_{n-1}Cu_nO_x$ for n equal to 3, 4 or 5. This material had a $T_c$ only up to 120K and then only if it were made under high pressure and with partial carbon (C) substitution for copper (Cu). That material is quite different from the 126K Ba—Ca—Cu—O (or "BCCO") material system disclosed here. The prolonged annealings under different equilibrium conditions discussed above (FIG. 4) yielded different $T_c$'s for these two phases, which is indicative of the basic difference between the two materials and the phases therein.

It is known that all cuprate high temperature superconductors display a layered structure with a common stacking sequence of (charge-reservoir block)(active block), i.e., the chargereservoir block consists of two BaO— or SrO— layers separated by other cation-oxide layers, and the active block contains $CuO_2$— layers separated by cation layers. The layered structure permits the introduction of charge carriers to the $CuO_2$— layers in the active block without introducing detrimental defects to them via anion and/or cation doping of the charge-reservoir block. Compounds without a charge-reservoir are not superconducting. $T_c$ increases with the number of $CuO_2$— layers in the active block, but peaks with three or four layers.

An examination of existing $T_c$ data seems to reveal that compounds with a simple charge reservoir block usually have a higher $T_c$. These simpler charge reservoir blocks typically contain barium, but do not contain rare earth elements. For example, $YBa_2Cu_3O_7$ displays a $T_c$ of about 93K, in contrast to $YBa_2Cu_4O_8$, which has a more complex charge-reservoir block and a $T_c$ of about 80K. Thus, as an aspect of this invention it was hoped that a simpler charge reservoir may be an easier way to retain the integrity of and improve the coupling between the $CuO_2$ layers in the active block.

Under this hope, a desirable compound would be $Ba_2Ca_2CU_3O_{8-\delta}$, which includes a simple $(BaO)_2$ charge reservoir and an active block of three $CuO_2$ layers separated by two calcium layers. Unfortunately, such a hypothetical compound is too unstable to exist even under a high pressure synthesis procedure and the valence of copper therein is too difficult to adjust for maximum $T_c$. In accordance with this invention, therefore, calcium ions or a combination of calcium and copper ions were inserted between the double BaO layers by a high pressure synthesis procedure, which reduced Coulomb repulsion and adjusted the copper valence. In this manner a material was synthesized under high pressure having the cation ratio of $Ba_2Ca_{n-1+x}Cu_{n+y}O_z$, which at n=3 has a phase composition of a $T_c$ up to 126K when x is about 0.9±0.1 and y is about 0.7±0.1. In this same system, but at n=4, the material produced has a phase composition of Tc of 116K.

This material with its contained phase composition(s) was synthesized from compacted pellets of binary (i.e., CaO and CuO) and ternary (i.e., $Ba_2Cu_3O_5$) oxides with a material nominal formula of $Ba_2Ca_{2+x}Cu_{3+y}O_z$. The pellets were calcinated in flowing oxygen at a temperature between 650 and 900° C. for 40 to 48 hours, and twice during this period the pellets were pulverized and recompacted. The pellets were then powdered, mixed with AgO (silver oxide) as an oxidizer, and heated in a multi-anvil Walker module at 5–6 GPa and 800–1000° C. for 0.5 to 24 hours. Great caution was taken to avoid unintended carbon contamination from air or heating furnaces used for the high pressure synthesis since it was found that such contamination adversely affects the formation of the 126K phase.

Figure 6:
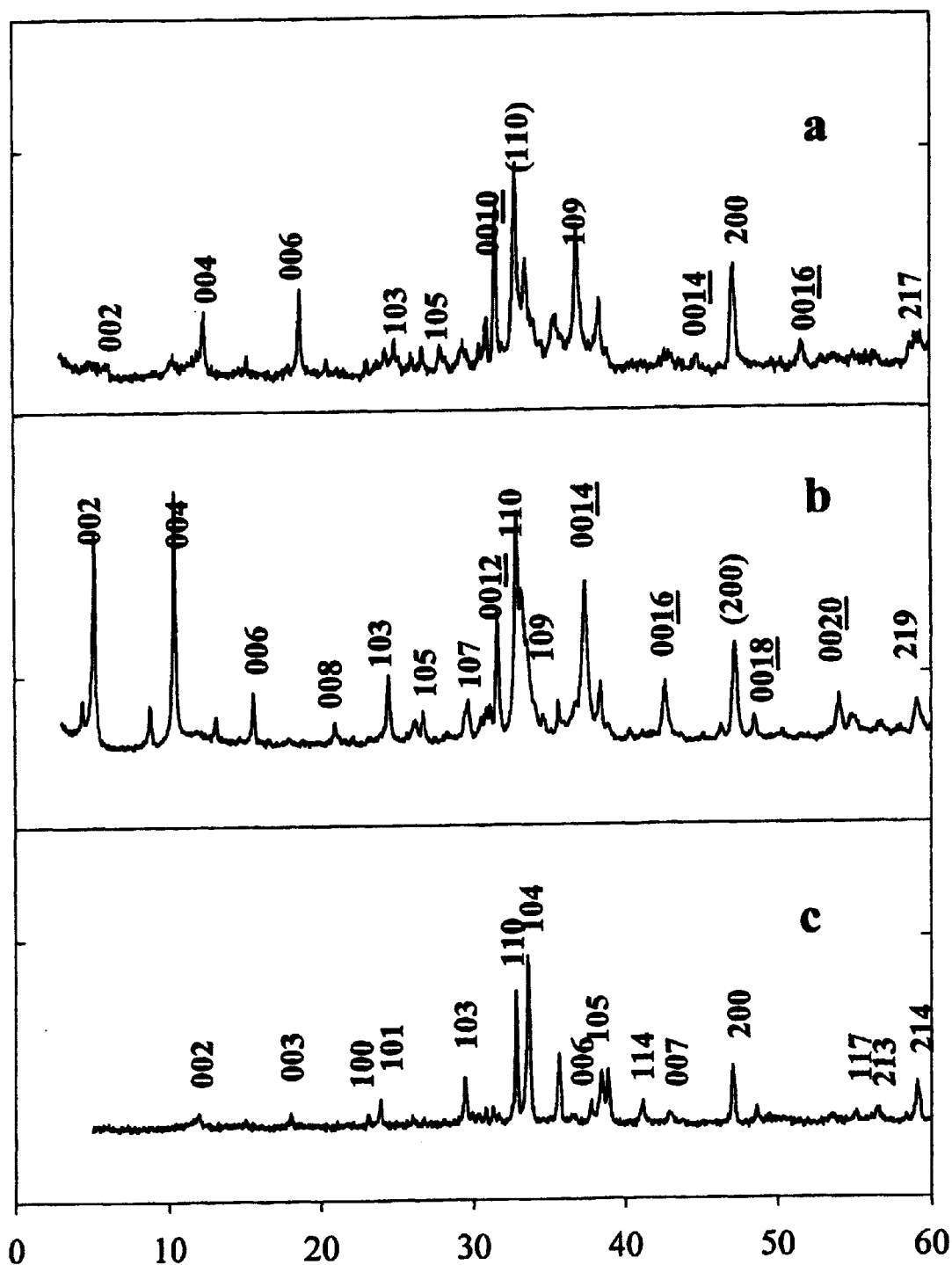
FIG. 6 shows X-ray diffraction patterns for $Ba_2Ca_{2+x}Cu_{3+y}O_z$ before (a) and after (b) exposure to humid air and also for comparison an as made sample of (Cu, C) $Ba_2Ca_2Cu_3O_x$ which is (c).

With reference to FIG. 6, for the compound thus obtained, the X-ray defraction pattern changes with exposure to humid air are demonstrated. Patterns a and b in FIG. 6 are for this material before and after exposure to humid air, respectively. For comparison, pattern c is the X-ray defraction pattern for (Cu, C) $Ba_2Ca_2Cu_3O_z$. X-ray defraction patterns a and b indicate a body-centered tetragonal structure with an I4/mmm symmetry with crystalline lattice parameters of an "a" axis of a=3.85 angstroms (Å) and a "c" axis of c=28.2 Å. The wave dispersive spectrometer and energy dispersive spectrometer for X-ray analysis measurements show a cation ratio of the compound to be Ba:Ca:Cu equal to 2:2.5±0.1:3.5±0.1.

Figure 7:
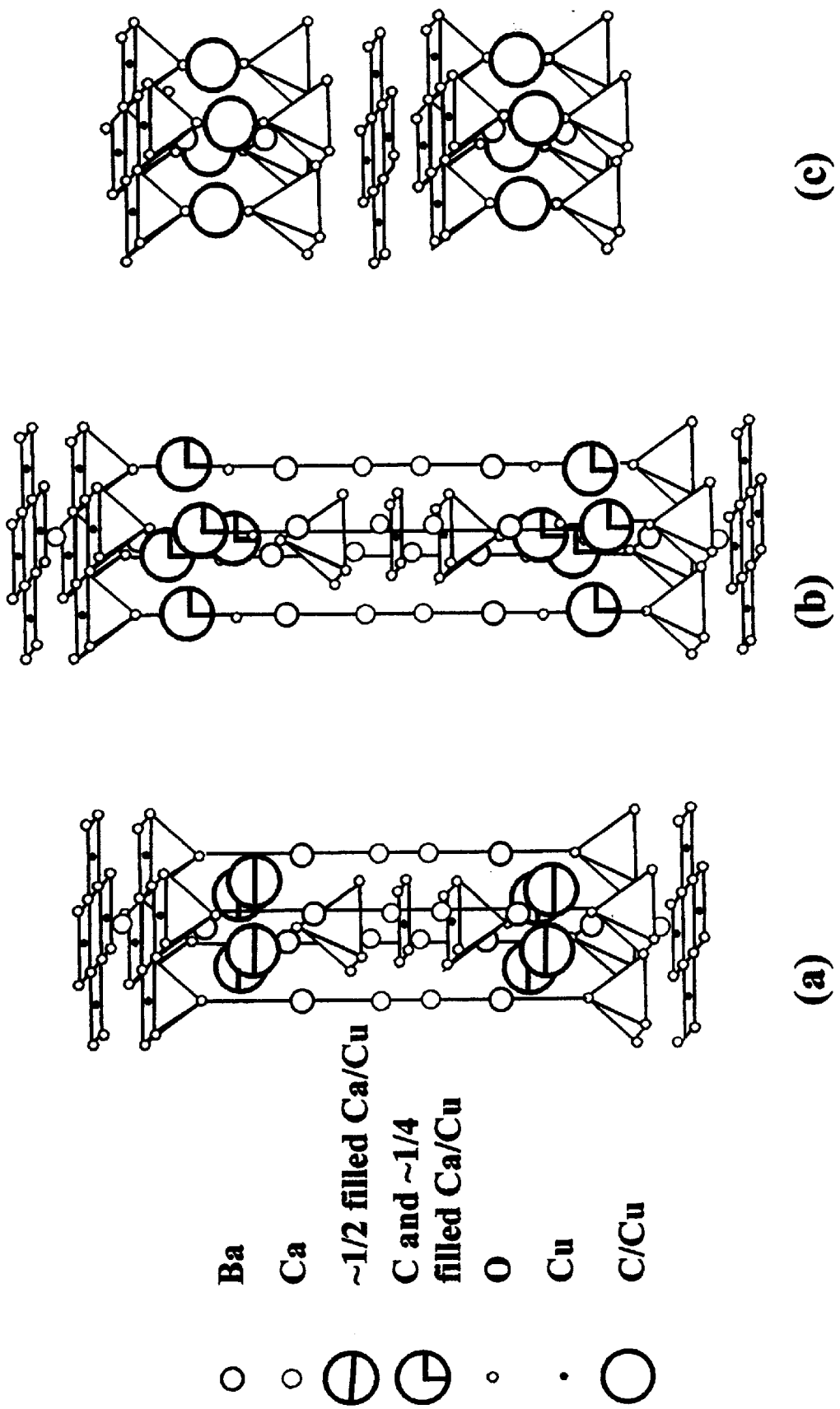
FIG. 7 shows a proposed atomic arrangement for $Ba_2Ca_{2+x}Cu_{3+y}O_z$ before (a) and after (b) exposure to humid air and also for comparison an as made sample of (Cu, C) $Ba_2Ca_2Cu_3O_z$ (c).

With reference to FIG. 7, a schematic atomic arrangement is proposed for $Ba_2Ca_{2.5\pm0.1}Cu_{3.5\pm0.1}O_{8+\delta}$. This represents a stacking sequence of $[(BaO)(Ca,Cu)(BaO)]\text{-}[(CuO_2)(Ca)(CuO_2)(Ca)(cyO_2)]$, with the (Ca, Cu)— layer only partially filled to form the charge-reservoir block as here intended. Atomic arrangements (a) and (b) are for before and after exposure to humid air, respectively, while arrangement (c) is for a (Cu,C) $Ba_2Ca_2Cu_3O_z$ material.

Figure 8:
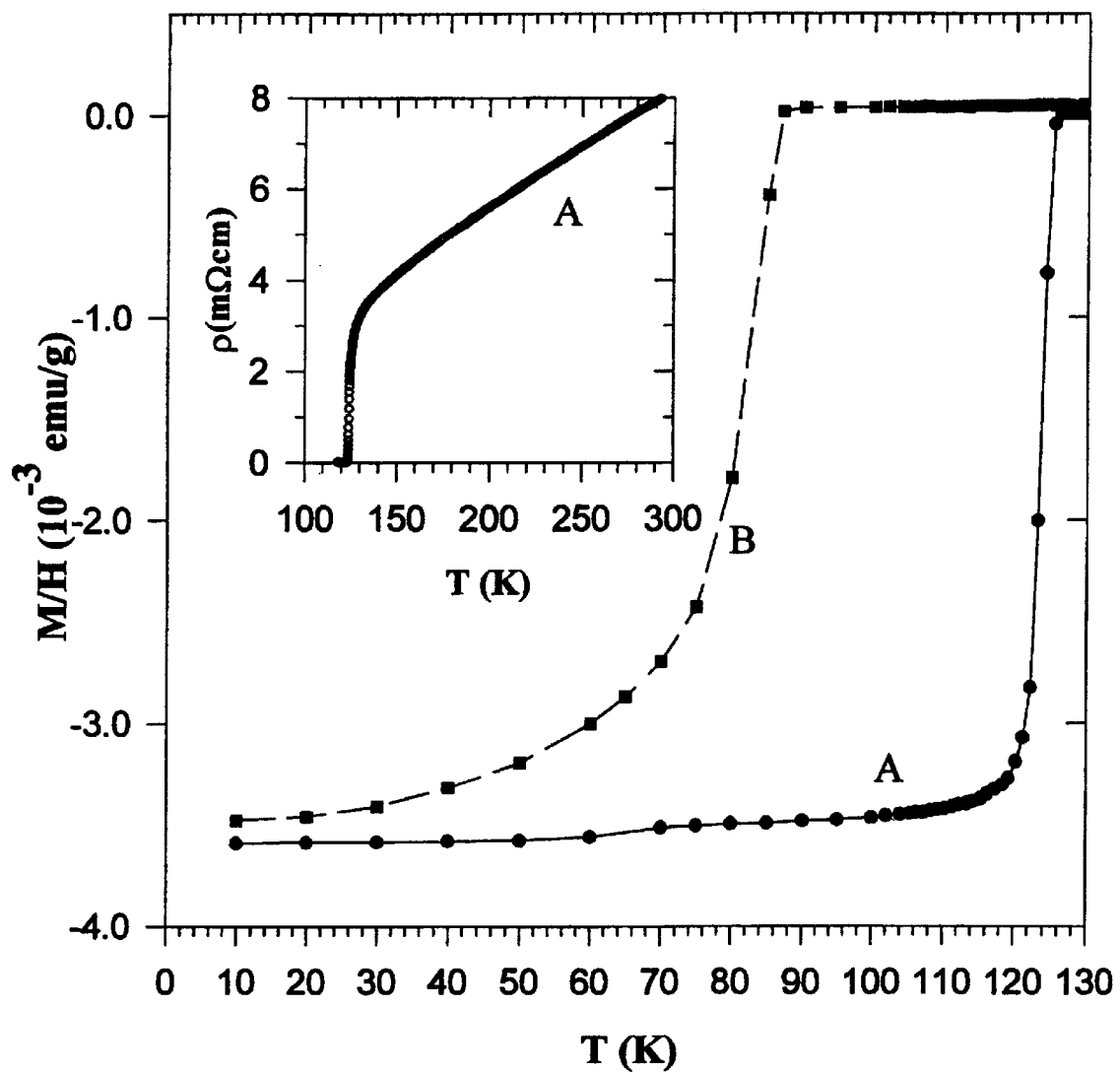
FIG. 8 shows magnetic susceptibility, $\chi_{g(10^{-3}emu/g)}$, of $Ba_2Ca_{2+x}Cu_{3+y}O_z$ before (a) and after (b) exposure to humid air, and the inset shows resistivity, $\rho$, for an unexposed (a) sample of $Ba_2Ca_{2+x}Cu_{3+y}O_z$.

With reference to FIG. 8, a superconducting transition temperature of 126K is clearly evident in the DC magnetic and resistive measurements. The BCCO material compound with a $T_c$ 126K phase appears to be unstable in hunid air and transforms to a phase with a $T_c$ of about 90K as also shown in FIG. 8. The X-ray diffraction pattern for this transformed phase is provided in FIG. 6, pattern (b), which shows an expanded axis c=33.8 Å due to the intercalation of $(CO_2)$ and/or (OH) radicals in the charge-reservoir block. A possible atomic arrangement for this BCCO phase after exposure to humid air is provided in FIG. 7(b).

In further studies, 126K superconductivity was observed with a large superconducting volume fraction of greater than 30%. In addition to simple metal oxides and binary metal oxides. a ternary Ba—Ca—Cu oxide having $T_c$ of 116K was detected with cation ratios of Ba:Ca:Cu:C equal to 2:2+x:3+y 0±0.04 wherein x≅y≅0.6. The values of x equal to 2(Ca:Ba-1) and y equal to 2(Ca:Ba-1.5) change significantly from one sample to another, i.e. $0.4 \leq x \leq 0.9$ and $0 \leq y \leq 0.7$. However, both optimum $T_c$ and X-ray defraction patterns were the same for all the samples. It seems, therefore, that one oxide phase composition with a nonstochiometric charge reservoir block is responsible for the 126K superconductivity. As discussed above, this 126K phase composition is unstable in open air. Its $T_c$ degrades to 90K and its X-ray defraction pattern totally changes after a few hours of exposure to air, although the superconducting volume fraction (field-cooled magnetization) remains the same. These observations suggest a phase composition transformation during the air exposure. This property was used to simplify the phase identification.

Figure 9:
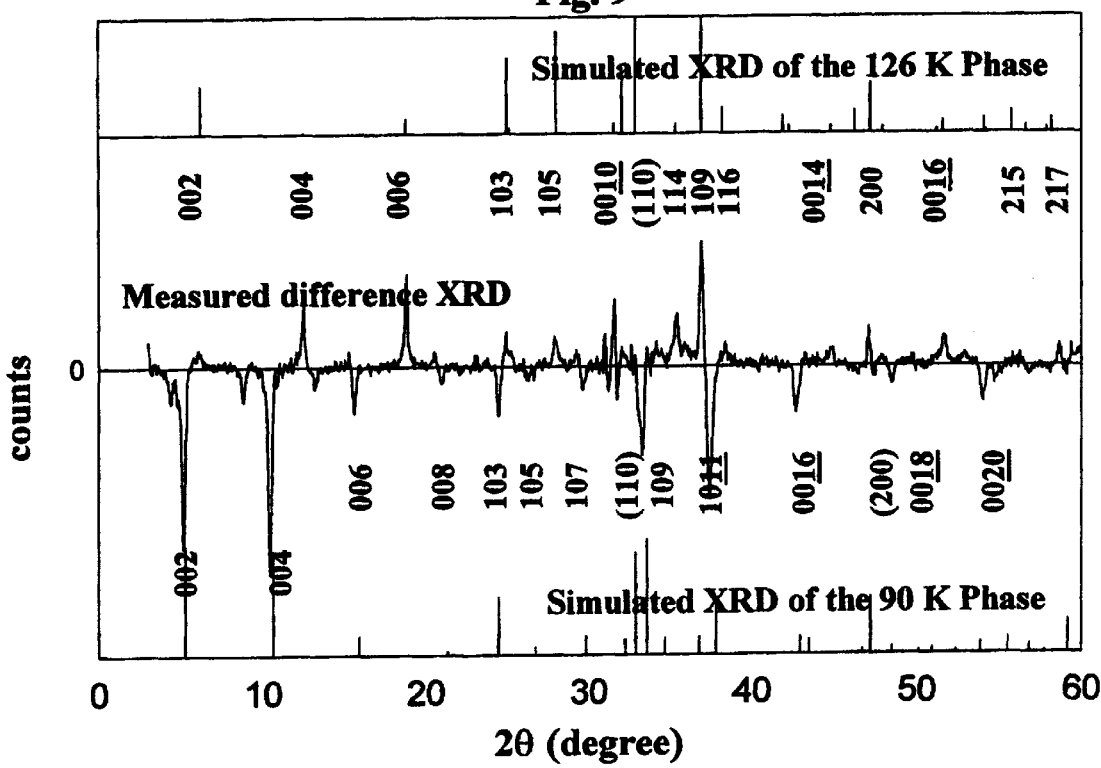
FIG. 9 shows a "differential" X-ray defraction pattern for a 126K sample, the top representing an X-ray defraction pattern for the 126K phase and the bottom representing an X-ray defraction pattern for the 90K phase which results from an exposure of this 126K composition to $CO_2$ and/or $H_2O$ in the atmosphere.

With reference to FIG. 9, a "difference pattern", which is the differential pattern between the fresh-sample XRD pattern taken under flowing $O_2$ of the 126K phase and the XRD pattern taken hours after air was introduced to the sample-chamber, was obtained. Lines of phase compositions within this material which are stable to this air exposure should cancel each other out, hence not appear in, or in effect be removed from this "difference pattern" for those phases which are stable in air. The positive lines in this pattern should thus represent the 126K phase composition and the negative ones the 90K phase composition, except for the (hk0) lines.

A crystalline composition, such as a ceramic composition—or other composition which are composed of a regular ordering of the atomic constituents thereof and thus may be analyzed by X-ray diffraction techniques—are composed of planes; both horizontal and vertical, of atomic constituents in a regular and ordered pattern of arrangement. Such planes of regularly ordered atomic constituents therefore define various spatial points of possible atomic occupancy by these atomic components; these being in a space defined by an "a"×"b"×"c" subunit cell, a unit cell or a super unit cell structural space which will account either for the basic empirical formula (empirical formula unit cell) or a super empirical (unit cell) formula for the said compound which accounts for its properties. The "basal" or base plane of any sub cell, empirical unit formula cell, or of any super empirical unit cell formula, of such composition, is defined by the "a" and "b" dimensions (Å) of this containing cell space. Within this containing cell space defined by the "a"×"b"×"c" cell dimensions (Å) there are atomic occupation sites which are: corners, edges between corners, face planes, and cell internal sites as these atom occupation positions are defined by the a–b and a–c corner; and the a–b, a–c, c–b and c–a lines and planes which define the sub unit cell corners, edges, planes and internal sites which together comprise the empirical formula unit cell or the super empirical unit cell formula. In this respect as per any sub cell thereof, a corner position located atom is ⅛ positioned within this a×b×c space; an edge located (an a–b, a–c, c–b or c–a edge) atom is ¼ positioned with this a×b×c space; a face plane located atom (a×b or b×c or a×c or b×c plane) is ½ positioned within this a×b×c space; and an atom totally within the a×b×c space is fully located (1 positioned) within this space.

By this convention one may speak to a composition of atomic elements that comprises a sub cell, an empirical formula unit cell or a super empirical unit cell formula of a compound in question.

In the "difference pattern" of FIG. 9, only the h, k and l lines for which h+l+k sums to an even number are shown for both the 126K and the 90K phase compositions, suggesting a body-centered symmetry. The "c" lattice constant, which is about 28.2 angstroms (Å), of the 126K phase composition, is between the "c" of about 29.6 Å of a $Cu_{0.5}C_{0.5}Ba_2Ca_2Cu_3O_{8+\delta}$ composition and the "c"<27 Å of a hypothetical $Ba_2Ca_xCu_{33}O_{8+\delta}$ composition. Therefore, the structure of the 126K phase composition is thought to be a periodic stacks of a 3—$CuO_2$ plane block and a charge reservoir block of BaO—$Ca_xCu_y$—BaO. The cations $Ca_x$-$Cu_y$ occupy the 4d (0.1/2.1/4) sites of the 14/mmm cells between two adjacent BaO layers, as shown in FIG. 7(a) and 7(b). The related bond-lengths are in agreement with those of other cuprates. Both $CO_2$ and $H_2O$ play essential roles in the phase transition between the 126K phase composition to a 90K phase composition. It is believed that the BaO—$Ca_xCu_y$—BaO block of the 126K phase composition absorbs $CO_2$ and $H_2O$ and transforms into a block of BaO—$(Ca_{x/2}Cu_{y/2}C_vH_t)_2$—BaO in a rock salt configuration during the phase transformation (FIG. 7b) to the 90K phase composition. XRD patterns were simulated in both cases (FIG. 9 top and bottom bars). The agreement is good without adjusting the atomic positions.

Any given unit cell comprising a unit formula of $Ba_2Ca_{2+x}Cu_{3+y}O_{8+\delta}$ overlies 4 unit cells of the same empirical formula in the rank below it and is overlain by 4 unit cells of the same empirical formula in the rank above it, such that the c crystalline axis of any unit cell does not axially line up with the unit cell c axis of those unit cells below or above it in rank but is offset therefrom so that the ab plane of a given unit cell overlaps ¼ of the ab planes of each of the 4 unit cells in the ranks below and above it.

With respect to a formula of $Ba_2Ca_{2+x}Cu_{3+y}O_{8+\delta}$; a unit cell containing this unit formula comprises as a sub-cell block an "active block" containing a sub formula of $Ca_2Cu_3O_6$ and two end sub cell block comprising a sub formula of $Ba_2$(½ filled: $Ca_xCu_y)_1O_2$ or, otherwise expressed $Ba_2(Ca_xCu_y)O_2$. This end capping block is the "charge reservoir" which separates the "active block" of this unit cell from the active blocks of other unit cells of the same phase composition in overlying or underlying ranks. Hence, the basic empirical formula of the 126K superconducting phase composition is the sum of the end block charge reservoir sub cell and the active block sub unit cell; namely:

$Ca_2Cu_3O_6$ (active block)

$Ba_2(Ca_xCu_y)O_{2+\delta}$ (charge reservoir)

$Ba_2(Ca_2Cu_3(Ca_xCu_y)O_{8+\delta}$ (unit cell).

The active block of sub formula $Ca_2Cu_3O_6$ contains three layers of $CuO_2$ each of which, when considered in conjunction with contiguous cells in the same rank, appear as three square planes. These layers of Cu—O—Cu—O are separated from one another by two layers of Ca. Hence. $Ca_2Cu_3O_6$ is an element of this active block sub unit formula.

The $CuO_2$ layers of an active block in any rank of contiguous unit cells is separated from that of the $CuO_2$ layers of an active block in any overlying or underlying rank of contiguous unit cells by their respective charge reservoir blocks which, too, form layers separating these ranks.

Upon exposure to $CO_2$ and/or $H_2O$, as in atmospheric air, with time, the charge reservoir block of a unit cell structure of a 126K HTS material undergoes a transformation of its crystalline unit structure by intercalation of the oxygen, carbon and/or hydrogen components thereof while the active block of the cell and 126K composition remain unchanged. Hence, the charge reservoir block of formula $Ba_2(Ca_xCu_y)$ $O_2$ undergoes a transformation to $Ba_1$(¼ filled: $Ca_xCu_yH_vC_1)_2O_2$, or otherwise stated $Ba_2(Ca_{x/2}Cu_{y/2}H_vC_t)_2O_2$ and the crystalline structure transforms to an HTS material of $T_c=90°$ K., the overall formula of which may be represented by $Ca_2Cu_3O_6$ (active block)

$Ba_2(Ca_{x/2}Cu_{y/2}H_vC_t)_2O_{3+\delta}$ (transformed charge reservoir)

$Ba_2Ca_2Cu_3)Ca_{x/2}Cu_{y/2}H_vC_t)_2O_{10+5}$.

Figure 10:
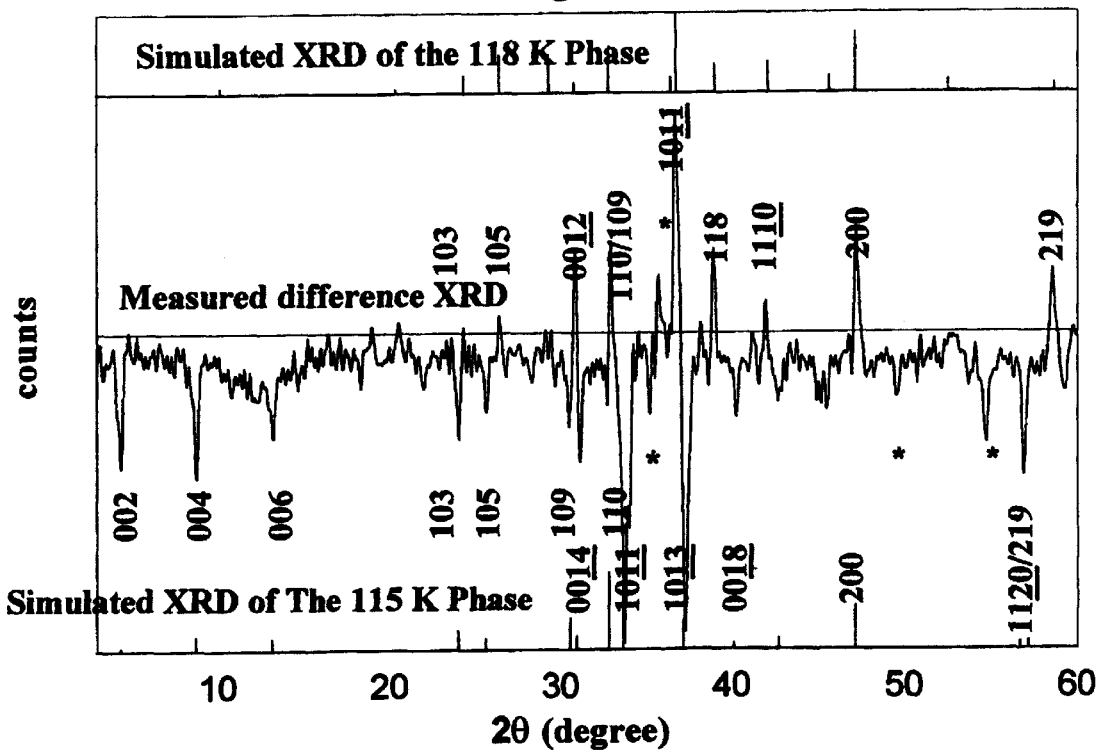
FIG. 10 shows a "differential" X-ray detraction pattern for a 116K superconducting phase, the top simulating an X-ray defraction of the 116K phase and the bottom simulating an X-ray defraction of its 114K transformation product.

116K phase is $Ba_2Ca_3Cu_4(Ca_xCu_y)O_{10+\delta}$ and its transformation product is $(Ca_{x/2}Cu_{y/2}H_vC_t)_2Ba_2Ca_3Cu_4O_z$. The simulated XRD patterns again agree reasonably with the data (FIG. 10).

Thus, in this work two new superconducting Ba—Ca—Cu oxides were identified as $Ba_2Ca_2Cu_3(Ca_xCu_y)O_{8+\delta}$ and $Ba_2Ca_3Cu_4(Ca_xCu_y)O_{10+\delta}$ with $T_c$ of 126K and 116K, respectively. The cations ($Ca_xCu_y$), with x as 0.4 to 0.9 and y as 0.0 to 0.7, are inserted between two adjacent BaO layers to stabilize the structures and to adjust the copper (Cu) atom valences. Both of the 126K and 116K superconducting phase compositions show the body-centered symmetry, but with different lattice constants of (a, c crystalographic axis) equal to (3.8, 28.2) and (3.8, 34.8) Å, respectively. These HTS Ba—Ca—Cu—O compounds are unstable against the incorporation of $CO_2$ and $H_2O$ in open air. The transformed HTS products of these HTS compounds are, respectively, of the formulae $(Ca_{x/2}Cu_{y/2}H_vC_t)_2Ba_2Ca_2Cu_3O_{10+\delta+d}$ and $(Ca_{x/2}Cu_{y/2}H_vC_t)_2Ba_2Ca_3Cu_4O_{10+\delta+d}$ and each of the transformation compounds have an expanded crystallographic c axis of 33.8 and 40.2 Å and a lower $T_c$ of 90 and 114K, respectively.

The idealize formula of these superconducting compositions may be portrayed in a manner that segregates those elements comprising the charge reservoir layer elements and the active block layer elements thereof into identifiable subformula units, as follows:

[BaO—$(Ca_xCu_y)O_\delta$—BaO][$CuO_2$—$(Ca$—$CuO_2)_{n-1}$], with the left-hand side of this formula presentation being representative of the layer segments comprising the charge reservoir and the right-hand side of this formula presentation being representative of the layer segments comprising the active block of the HTS phase composition. In this representation of the formula, $\delta$ is a value which provides for a valence balance of all elements to neutrality and accounts for the variance in valence of Cu between a valence of +2 to +3.

Relative to the above formula presentation, the $H_2O$ and/or $CO_2$ intercalation transformation products of these HTS compositions would be represented by the formula:

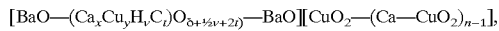

wherein v, t and (½v+2t) indicate the quantities of H, C and O intercalated from exposure to $H_2O$ and/or $CO_2$.

Modifications and alterations to the embodiments disclosed herein will be apparent to those skilled in the art in view of this disclosure. However, it is intended that all such variations and modifications fall within the spirit and scope of this invention as claimed.

We claim:

1. A material, comprising: a metal oxide of the formula $Ba_ACa_BCu_CO_Z$ wherein A is 2, B is 2.5±0.5, C is 3.5±0.5 and Z is a quantity of oxygen which balances the valence requirements of the Ba—Ca—Cu metals and which renders the phase composition to be superconductive; which material contains a phase composition composed Ba—Ca—Cu—O which is superconductive when at a temperature of at least 90° K.

2. The material of claim 1, wherein that phase composition of Ba—Ca—Cu—O has a metal content consisting essentially of Ba, Ca and Cu.

3. The material of claim 1, wherein said phase composition of Ba—Ca—Cu—O comprises at least about 25 volume % of said material.

4. The material of claim 1, wherein that phase composition of Ba—Ca—Cu—O which is superconductive is superconductive at a temperature of or greater than 116K.

5. A material of comprising: a metal oxide the metal content of which is Ba, Ca and Cu which material contains a phase composition composed of Ba—Ca—Cu which is superconductive when at a temperature of at least 90° K., wherein that phase composition of Ba—Ca—Cu—O is one within a formula as follows:

$Ba_2Ca_{n-1+x}Cu_{n+y}O_z$ wherein n is 3 or 4, x is 0.4 to 0.9, y is 0 to 0.7, z is a quantity of oxygen which balances the valence requirements of the Ba—Ca—Cu metals and which renders the phase composition to be superconductive.

6. The material of claim 5, wherein n=3 and the phase composition of Ba—Ca—Cu—O is superconductive at a temperature of about 126K.

7. The material of claim 6, wherein the material is formed to a nominal formula of $Ba_2Ca_{2+x}Cu_{3+y}O_z$ wherein x is 0.4 to 0.9, y is 0 to 0.7 and z is a quantity of oxygen which balances the valence requirements of the Ba—Ca—Cu metals and which renders the phase composition to be superconductive, and upon exposure of said material to an atmosphere containing carbon dioxide and water, a transformation of that Ba—Ca—Cu—O phase composition which superconducts at about 126K occurs to yield a phase composition which superconducts at about 90K of a formula as follows: $Ba_2Ca_2Cu_3(Ca_{x/2}Cu_{y/2}H_vC_t)_2O_{z+d}$ wherein v, t and d indicate quantities of hydrogen, carbon and additional oxygen which have intercalated into said material.

8. The material of claim 5, wherein n=4 and the phase composition of Ba—Ca—Cu—O is superconductive at a temperature of about 116K.

9. The material of claim 8, wherein the material is formed to a nominal formula of $Ba_2Ca_{3+x}Cu_{4+y}O_z$ wherein x is 0.4 to 0.9, y is 0 to 0.7 and z is a quantity of oxygen which balances the valence requirements of the Ba—Ca—Cu metals and which renders the phase composition to be superconductive, and upon exposure of said material to an atmosphere containing carbon dioxide and water a transformation of that Ba—Ca—Cu—O phase composition which superconducts at about 116K occurs to yield a phase composition that superconducts at about 114K of a formula as follows: $Ba_2Ca_3Cu_4(Ca_{x/2}Cu_{y/2}H_vC_t)_2O_{z+d}$ wherein v, t and d indicate quantities of hydrogen, carbon and additional oxygen which have intercalated into said material.

10. A composition of matter having superconducting properties of the formula $Ba_ACa_BCu_CO_Z$ wherein A is 2, B is 2.5±0.5, C is 3.5±0.5 and Z is a quantity of oxygen which balances the valence requirements of the Ba—Ca—Cu metals and which renders the phase composition to be superconductive, wherein the composition is made using high pressure synthesis carried out at between about 5.5 and 6.0 GPa on a mixture of barium, calcium and copper oxides that were heated to between about 650 and 900° C. for 40 to 84 hours, wherein thereafter the high-pressure synthesis is maintained at a synthesis temperature of less than 1050° C.

11. The composition of claim 10, wherein the composition is made from a mixture of CuO and $Ba_2Cu_3O_5$.

12. The composition of claim 11, wherein the cation ratio of Ba:Ca:Cu is 2:3:4.

13. The composition of claim 11, wherein a high-pressure synthesis is maintained at a synthesis temperature of less than 950° C.

14. A composition of matter having superconducting properties, consisting essentially of barium, calcium, cooper and oxygen, wherein a cation ratio of barium:calcium:cooper is 2.2+x:3+y, wherein x is 0.4 to 1.0 and y is 0 to 1.0, wherein the composition is made using high pressure synthesis carried out at between about 5.5 and 6.0 GPa on a mixture of barium, calcium and copper oxides that were heated to between about 650 and 900° C. for 40 to 84 hours, wherein thereafter the high-pressure synthesis is maintained at a synthesis temperature of less than 1050° C.

* * * * *

UNITED STATES PATENT AND TRADEMARK OFFICE
CERTIFICATE OF CORRECTION

PATENT NO. : 6,239,080 B1
DATED : May 29, 2001
INVENTOR(S) : Ching-Wu Chu, Yu-Yi Xue and Zhong L. Du It is certified that error appears in the above-identified patent and that said Letters Patent is hereby corrected as shown below:

Column 2,
Line 32, insert -- 1 -- before the number "16K" so that it reads -- temperature, $T_c$, of 126K and 116K have been discovered, --

Signed and Sealed this

Seventh Day of September, 2004

JON W. DUDAS
*Director of the United States Patent and Trademark Office*